United States Patent
Lee et al.

(10) Patent No.: US 7,298,214 B2
(45) Date of Patent: Nov. 20, 2007

(54) AMPLIFYING CIRCUIT WITH VARIABLE SUPPLY VOLTAGE

(75) Inventors: Chao-Cheng Lee, Hsin-Chu (TW); Tzung-Ming Chen, Taipei (TW); Chieh-Min Feng, Zhudong Town (TW)

(73) Assignee: Realtek Semiconductor Corp. (TW)

( * ) Notice: Subject to any disclaimer, the term of this patent is extended or adjusted under 35 U.S.C. 154(b) by 134 days.

(21) Appl. No.: 11/154,759

(22) Filed: Jun. 15, 2005

(65) Prior Publication Data
US 2005/0285682 A1    Dec. 29, 2005

(30) Foreign Application Priority Data
Jun. 28, 2004    (TW) .............................. 93118811 A

(51) Int. Cl.
*H03F 3/04* (2006.01)

(52) U.S. Cl. ..................................... 330/297; 330/136
(58) Field of Classification Search ................ 330/127, 330/129, 136, 278, 279, 297
See application file for complete search history.

(56) References Cited

U.S. PATENT DOCUMENTS

| | | | | |
|---|---|---|---|---|
| 4,873,493 A | * | 10/1989 | Fujiwara | ...................... 330/136 |
| 6,624,702 B1 | * | 9/2003 | Dening | ....................... 330/297 |
| 6,639,471 B2 | * | 10/2003 | Matsuura et al. | ........... 330/297 |

* cited by examiner

*Primary Examiner*—Khanh Van Nguyen

(57) ABSTRACT

An amplifying circuit with a variable supply voltage and a method thereof are disclosed. The amplifying circuit employs a voltage converter to adjust the supply voltage, thereby upgrading the energy efficiency of the circuit. The circuit also includes a control device, which can generate a control signal for controlling the voltage converter according to an output signal or input signal of the circuit.

19 Claims, 6 Drawing Sheets

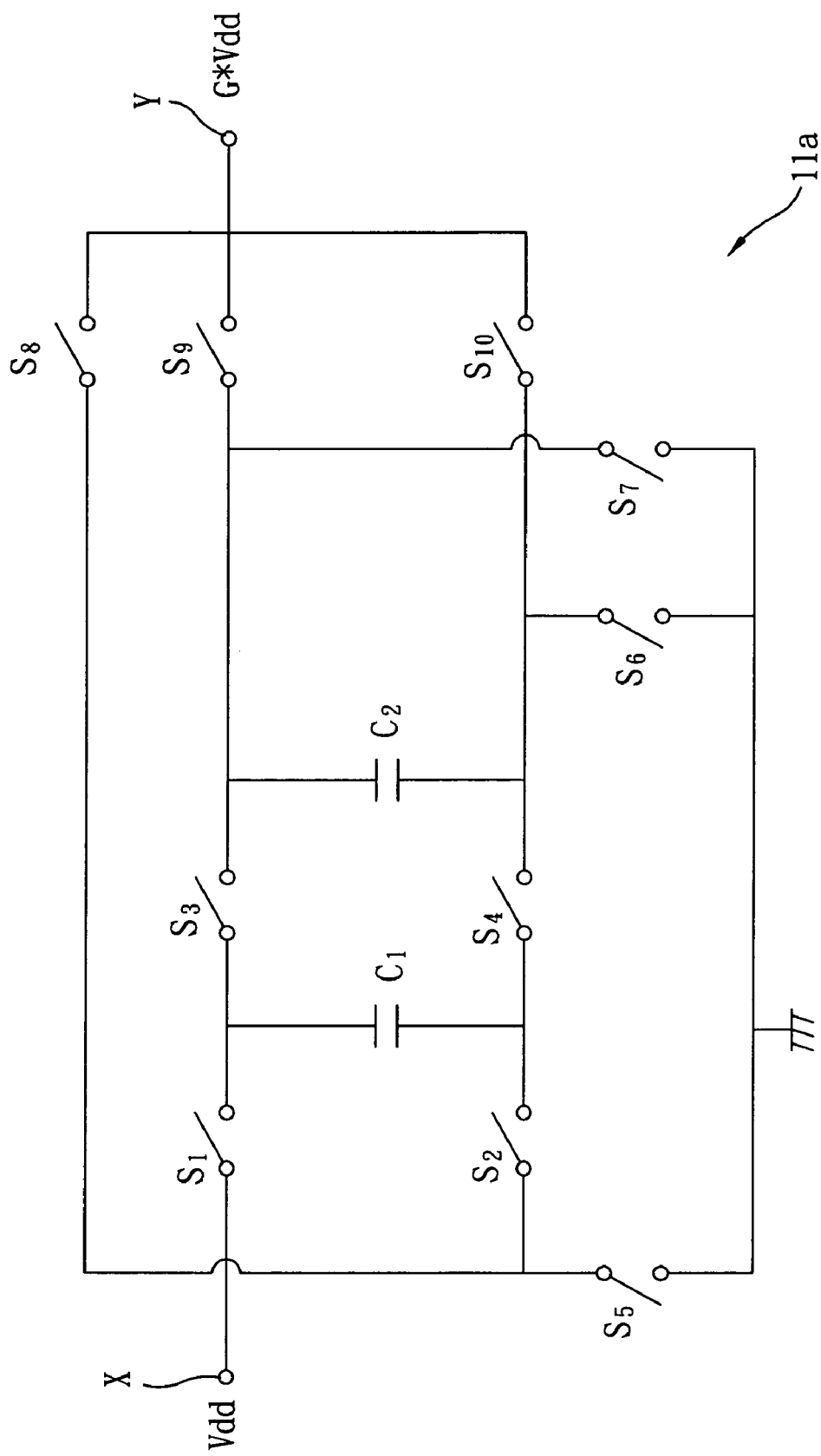
F I G. 2

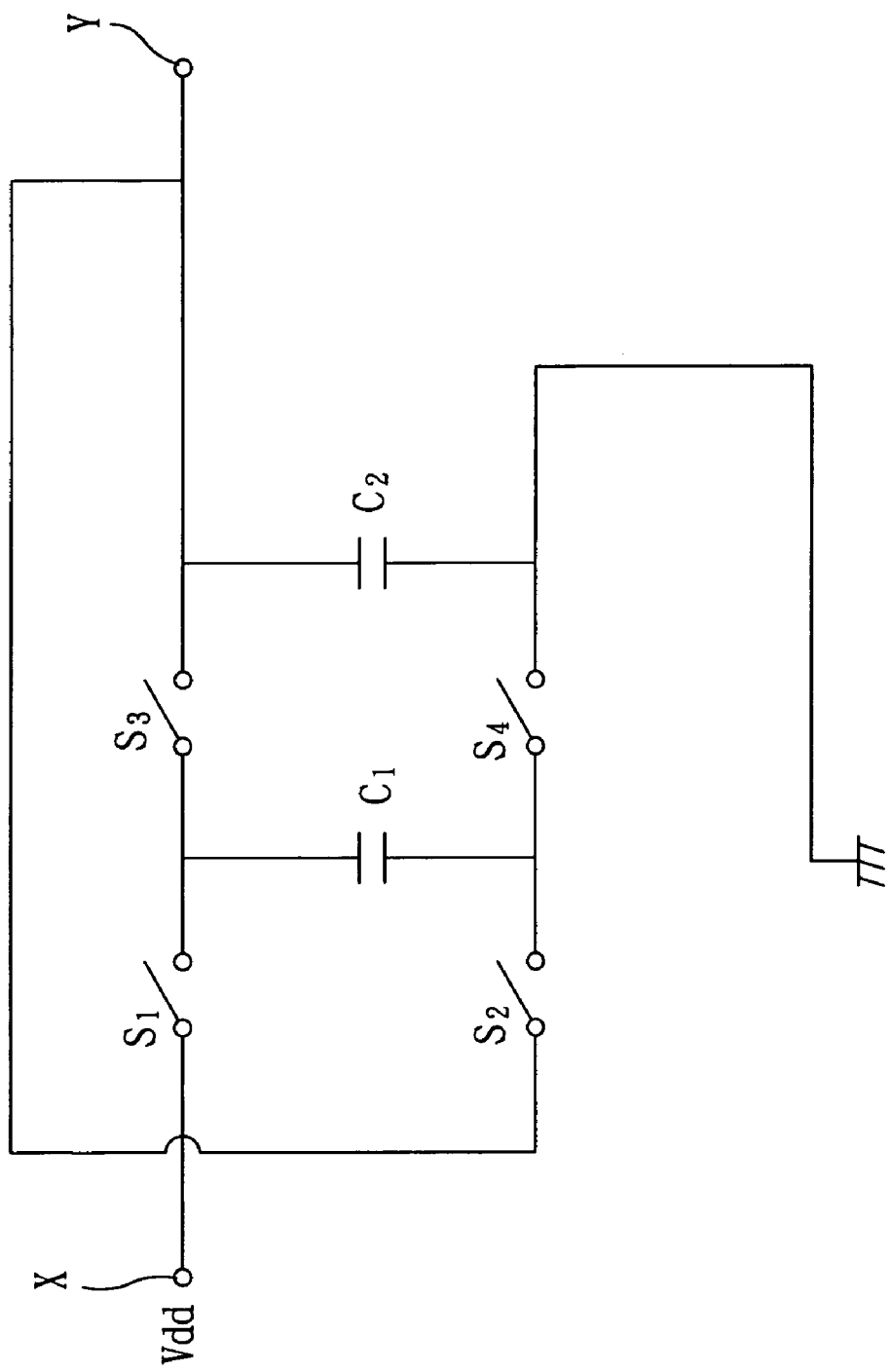
F I G. 3B

US 7,298,214 B2

AMPLIFYING CIRCUIT WITH VARIABLE SUPPLY VOLTAGE

BACKGROUND OF THE INVENTION (a). Field of the Invention

The present invention relates in general to electronic circuits, and more particularly to amplifying circuits with a variable supply voltage.

(b). Description of the Prior Arts

Amplifiers are very common circuit components. However, most amplifiers do not utilize power efficiently. In general, only a part of the energy provided to an amplifier will be used to drive the amplifier outputting an output signal according to an input signal. Most of the energy is wasted.

SUMMARY OF THE INVENTION

It is therefore an object of the present invention to provide an amplifying circuit with a variable supply voltage for solving the above-mentioned problems.

Another object of the present invention is to provide a method for adjusting a supply voltage provided to an amplifier that generates an output signal according to an input signal, thereby solving the above-mentioned problems.

According to an embodiment of the present invention, the amplifying circuit includes an amplifier and a supply voltage adjusting circuit. The supply voltage adjusting circuit, coupled to the amplifier, is for adjusting the voltage provided to the amplifier according to an input signal or an output signal of the amplifier.

According to another embodiment of the present invention, the method for adjusting the supply voltage includes: generating a control signal according to at least one of the input signal and the output signal; and adjusting the supply voltage according to the control signal.

BRIEF DESCRIPTION OF THE DRAWINGS

FIG. 2 is a circuit diagram of an embodiment of the voltage converter.

FIGS. 3A, 3B and 3C are respectively equivalent circuit diagrams of the voltage converter of FIG. 2 under different conditions.

DETAILED DESCRIPTION OF THE PRESENT INVENTION

Figure 1:
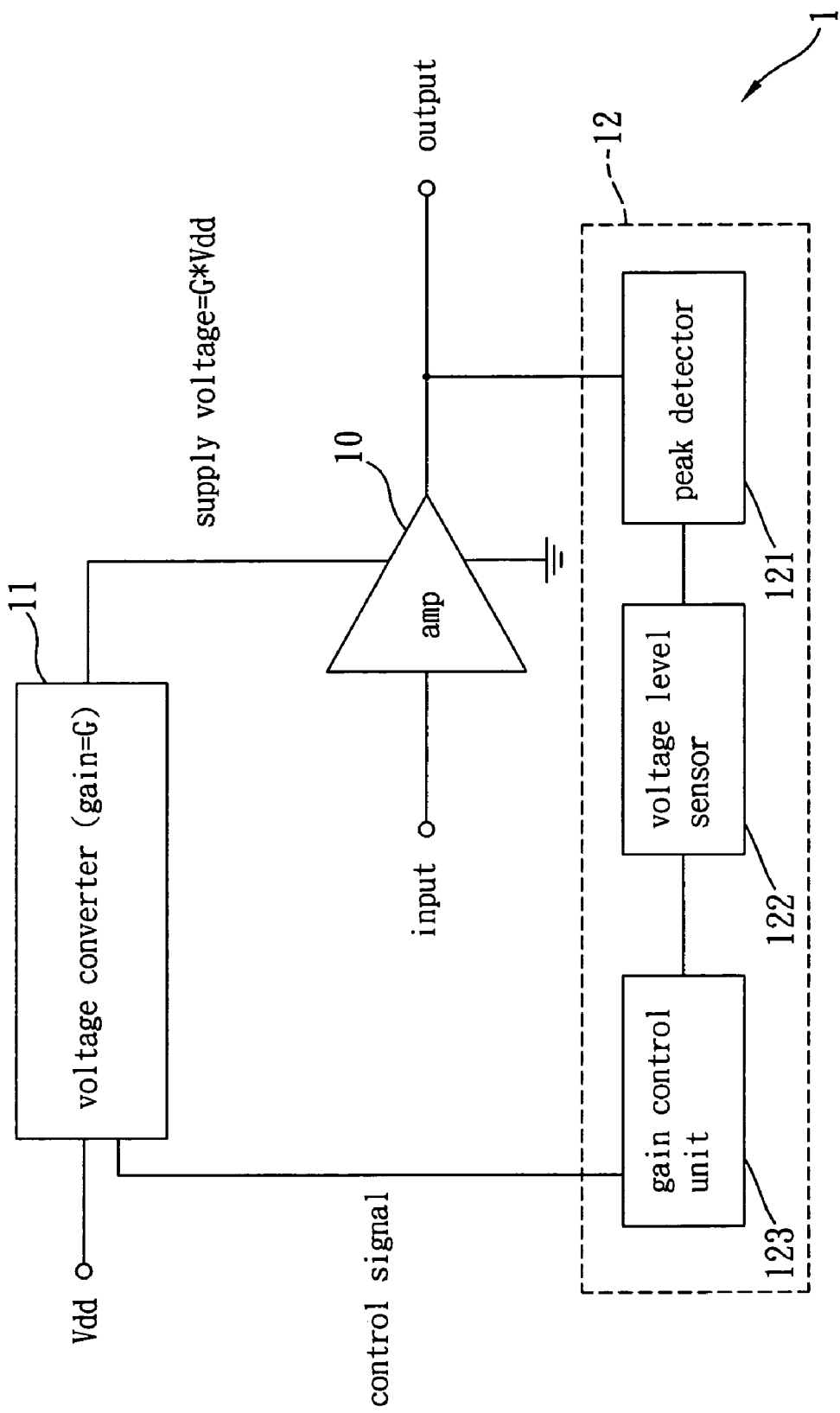
FIG. 1 is a block diagram of a preferred embodiment of the amplifying circuit according to the present invention.

FIG. 1 is a block diagram of a preferred embodiment of the amplifying circuit according to the present invention. As shown in FIG. 1, the amplifying circuit 1 includes an amplifier 10, a voltage converter 11, and a control device 12. The voltage converter 11 coupled to the amplifier 10 can transfer a received source voltage $V_{dd}$ into a supply voltage, and provide the supply voltage to the amplifier 10. If the gain of the voltage converter 11 is G, the supply voltage should be $G*V_{dd}$. The voltage converter 11 can further dynamically adjust the gain G according to a control signal outputted by the control device 12 as described in the following.

The control device 12 can generate the control signal according to an output signal of the amplifier 10. In this embodiment, the control device 12 includes a peak detector 121, a voltage level sensor 122 and a gain control unit 123. The peak detector 121 coupled to an output of the amplifier 10 is for detecting a voltage peak of the output signal of the amplifier 10. The voltage level sensor 122 coupled to the peak detector 121 has a plurality of voltage ranges, and outputs a signal to the gain control unit 123 according to the voltage range that the voltage peak detected by the peak detector 121 falls into. Consequently, the gain control unit 123 can output the control signal to the voltage converter 11 according to the voltage range corresponding to the voltage peak. The principle and implementation of the peak detector 121, the voltage level sensor 122 and the gain control unit 123 is well-known to those skilled in the art and not described in detail in this specification.

As described above, the voltage converter 11 can dynamically adjust its gain value G according to the control signal, and thereby provide an appropriate supply voltage to the amplifier 10. In this embodiment, the voltage converter 11 employs various coupling configurations of capacitors and switches to generate a plurality of gain values G. Hence, by turning on/off the switches, the voltage converter 11 can adjust the gain values G.

FIG. 2 is a circuit diagram of an embodiment of the voltage converter 11. As shown in FIG. 2, the voltage converter 11a is a switched-capacitor voltage converter, and includes two capacitors ($C_1$, $C_2$) and ten switches ($S_1$ to $S_{10}$). The input voltage (i.e. the voltage at X) is $V_{dd}$, and the output voltage (i.e. the voltage at Y) is $G*V_{dd}$, wherein G is the gain value of the voltage converter 11a. In operation, the states of switches $S_1$ and $S_2$ become connected (ON) or disconnected (OFF) according to a first clock signal and the states of switches $S_3$ and $S_4$ become connected or disconnected according to a second clock signal, wherein the first and second clock signals correspond to the control signal generated by the gain control unit 123 of FIG. 1. It is notable that the switches S1, S2 and the switches S3, S4 would not become connected simultaneously.

Figure 3A:
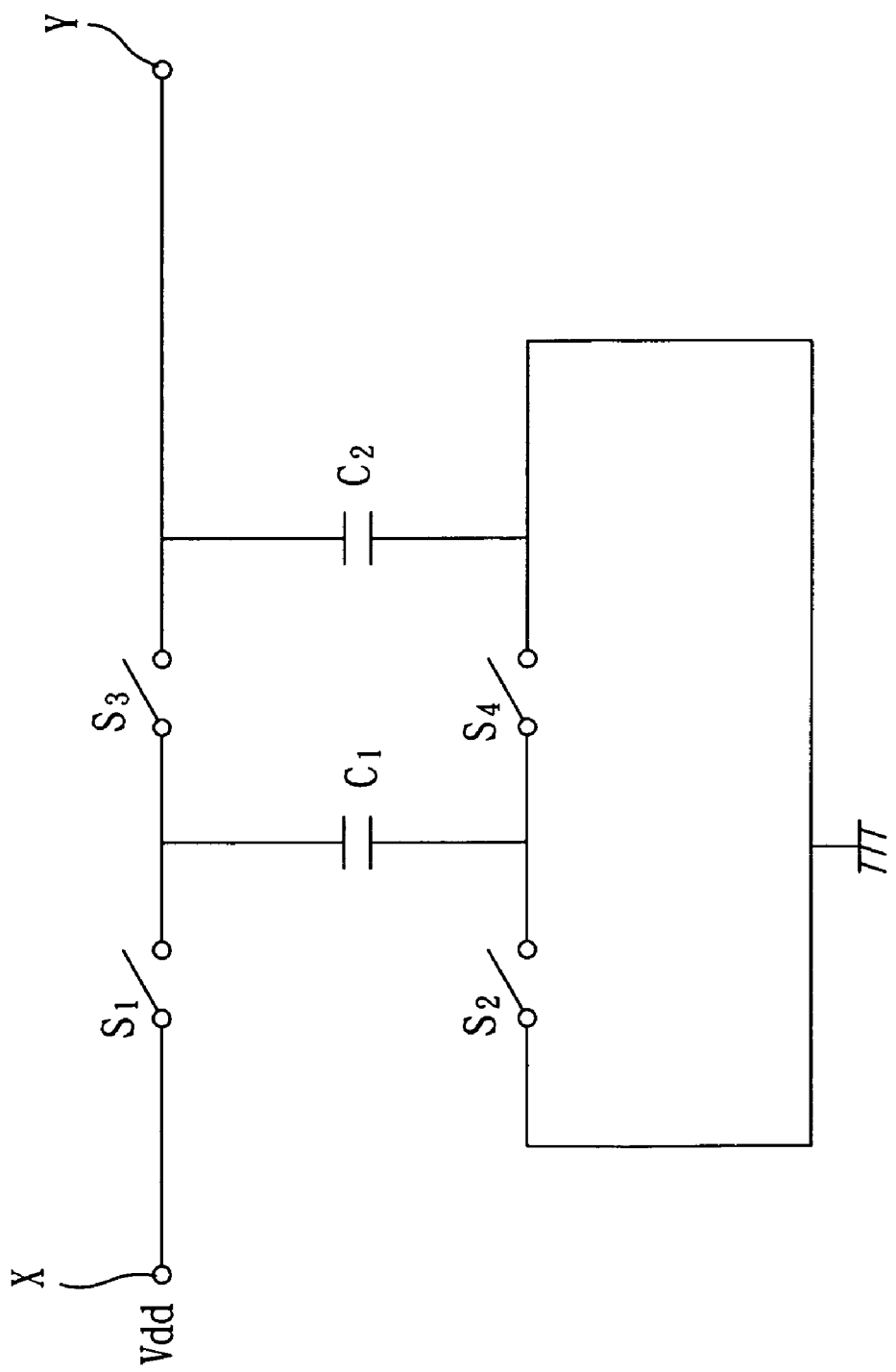

The voltage converter 11a of FIG. 2 corresponds to three gain values G, that is, 1, 0.5, and −1. These gain values G can be obtained by changing the on/off states of the switches $S_5$ to $S_{10}$. The relation between the gain value G and the on/off states of switches is described as below:

(1) If switches $S_5$, $S_6$ and $S_9$ are ON and switches $S_7$, $S_8$ and $S_{10}$ are OFF, then FIG. 2 can be equivalent to FIG. 3A. Accordingly, when switches $S_1$ and $S_2$ are ON (meanwhile, switches $S_3$ and $S_4$ are OFF), the voltage at capacitor $C_1$ becomes $V_{dd}$. Afterward, when $S_3$ and $S_4$ are ON (meanwhile, $S_1$ and $S_2$ are OFF), the voltage $V_{dd}$ at capacitor $C_1$ would be transferred to the capacitor $C_2$ such that the voltage at Y also becomes $V_{dd}$. Thus, the gain G under the present condition is 1.

(2) If switches $S_6$, $S_8$ and $S_9$ are ON and switches $S_5$, $S_7$ and $S_{10}$ are OFF, then FIG. 2 can be equivalent to FIG. 3B. Consequently, when switches $S_1$ and $S_2$ are ON (meanwhile, switches $S_3$ and $S_4$ are OFF), the voltage at capacitor $C_1$ becomes $V_{dd}*(1-G)$ (i.e. the voltage difference between X and Y). As a result, when $S_3$ and $S_4$ are ON (meanwhile, $S_1$ and $S_2$ are OFF), the voltage $V_{dd}*(1-G)$ at capacitor $C_1$ would be transferred to the capacitor $C_2$ such that the voltage at Y becomes $V_{dd}*(1-G)$. Hence the following equation is obtained:

$$V_{dd}*G = V_{dd}*(1-G)$$

Obviously, it can be derived that G equals 0.5.

Figure 3C:
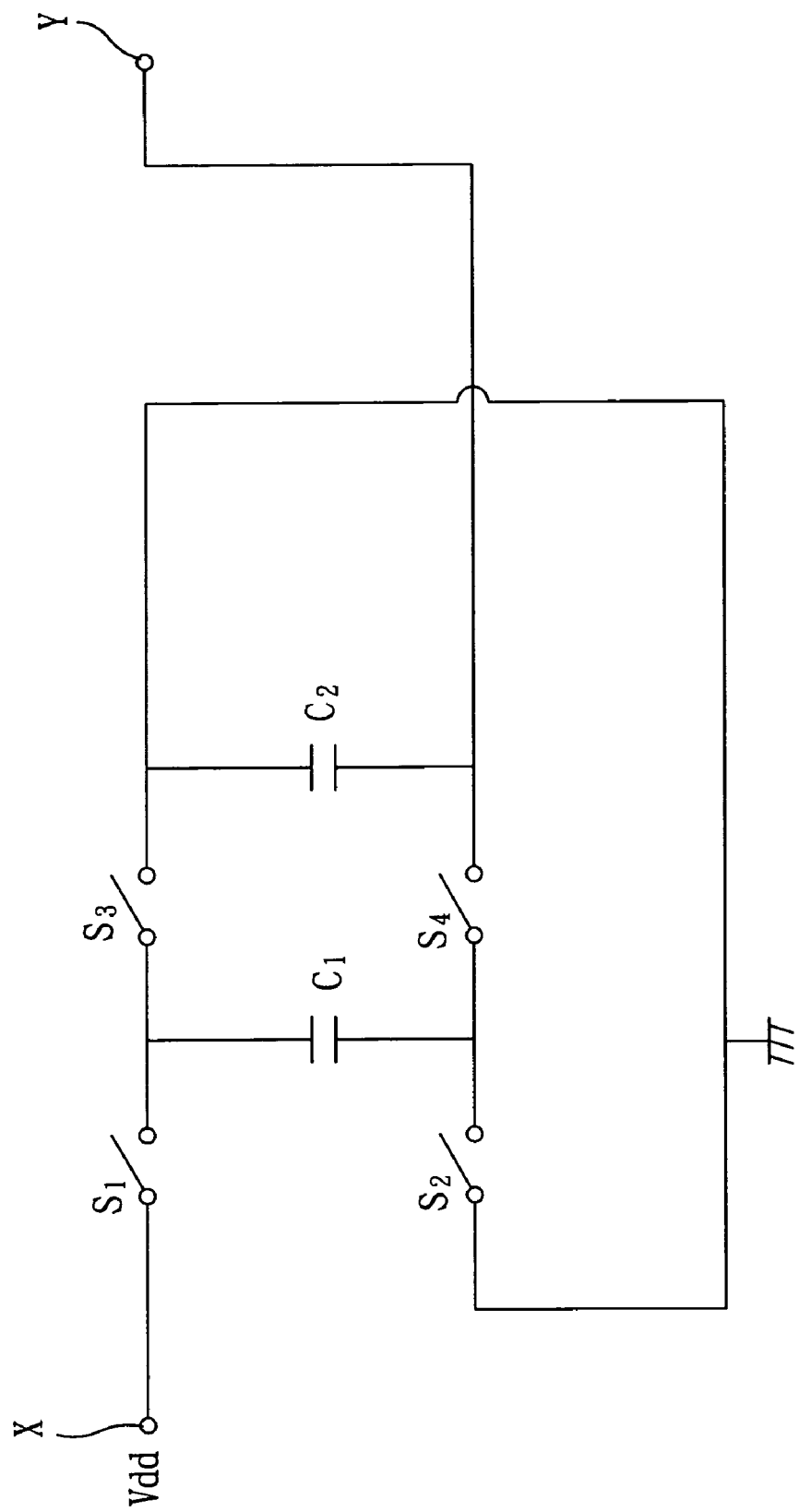

(3) If switches $S_5$, $S_7$ and $S_{10}$ are ON and switches $S_6$, $S_8$ and $S_9$ are OFF, then FIG. 2 can be equivalent to FIG. 3C. Therefore, when switches $S_1$ and $S_2$ are ON (meanwhile, switches $S_3$ and $S_4$ are OFF), the voltage at capacitor C, becomes $V_{dd}$. Subsequently, when switches $S_3$ and $S_4$ are ON (meanwhile, $S_1$ and $S_2$ are OFF), the voltage $V_{dd}$ at capacitor $C_1$ would be transferred to the capacitor $C_2$ such that the voltage at Y becomes $-V_{dd}$. Thus, G is −1.

Those skilled in the art can easily design a voltage converter having a plurality of gain values according to the present invention. Any embodiment for dynamically adjusting the supply voltage of an amplifier through a voltage converter would not lie outside the spirit and scope of the present invention.

Figure 4:
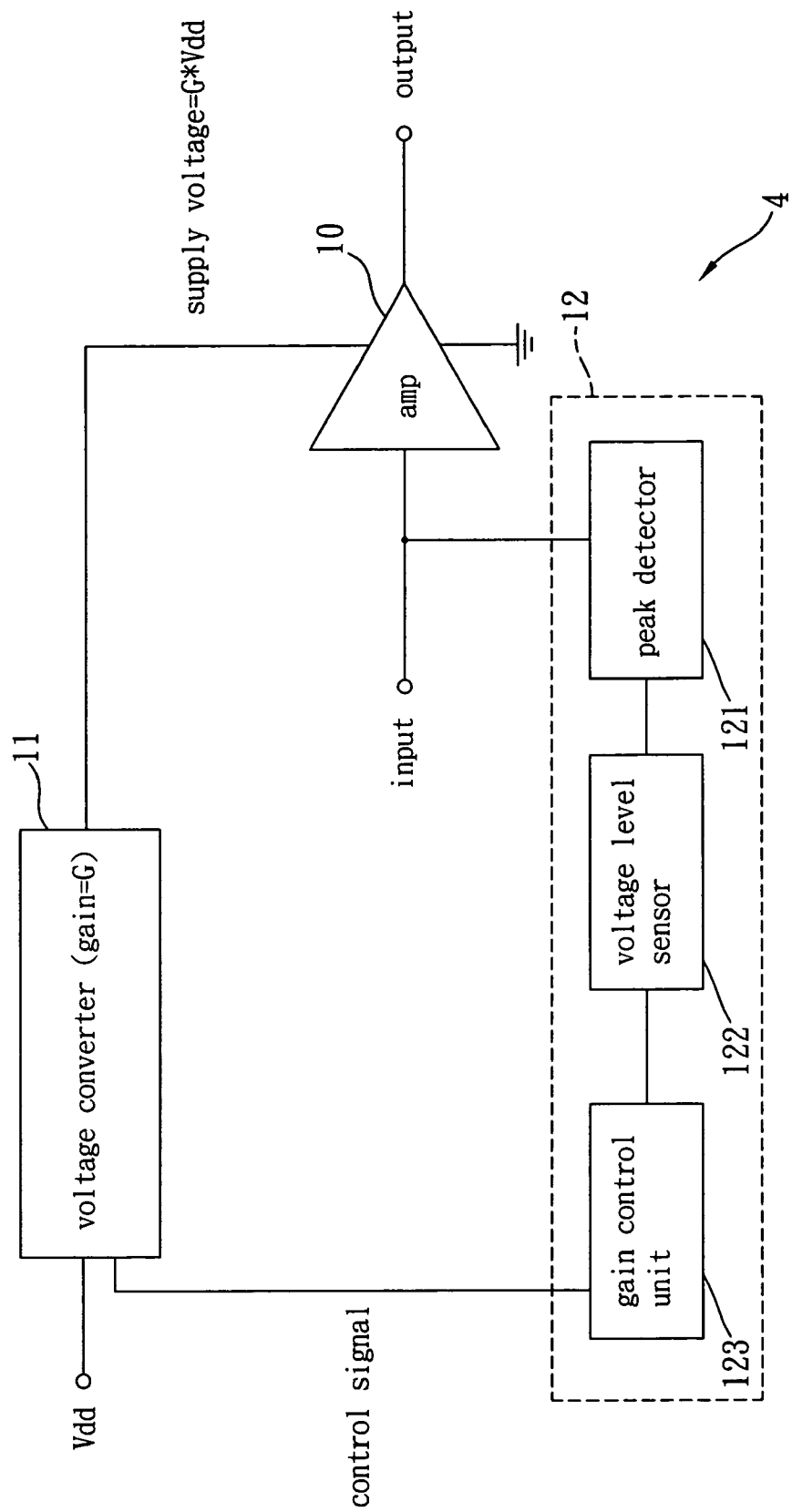
FIG. 4 is a block diagram of another preferred embodiment of the amplifying circuit according to the present invention.

FIG. 4 is a block diagram of another preferred embodiment of the amplifying circuit according to the present invention. Comparing the amplifying circuit 1 of FIG. 1 with the amplifying circuit 4 of FIG. 4, the difference between them is that the control devices 12 of FIG. 1 and FIG. 4 are respectively coupled to the output and input terminals of the amplifier 10. That is, the control device 12 of FIG. 4 generates the control signal according to an input signal of the amplifier 10 rather than an output signal. More specifically, the peak detector 121 of FIG. 4 detects the voltage peak of the input signal of the amplifier 10 and provides it to the voltage level sensor 123. The remaining portion of the amplifying circuit 4 operates in the same way as that of the amplifying circuit 1, and would not be described again here.

While the present invention has been shown and described with reference to the preferred embodiments thereof and in terms of the illustrative drawings, it should not be considered as limited thereby. Various possible modifications and alterations could be conceived of by one skilled in the art to the form and the content of any particular embodiment, without departing from the scope and the spirit of the present invention.

What is claimed is:

1. An amplifying circuit with a variable supply voltage comprising:
    an amplifier for receiving an input signal and outputting an output signal with the variable supply voltage; and
    a supply voltage adjusting circuit coupled to the amplifier for adjusting the variable supply voltage according to at least one of the input signal and the output signal;
    wherein the supply voltage adjusting circuit comprises a voltage converter having a plurality of gain values, the voltage converter selecting one of the gain values for providing the variable supply voltage according to at least one of the input signal and the output signal.

2. The amplifying circuit of claim 1, wherein the voltage converter selects one of the gain values according to a voltage peak of at least one of the input and the output signals.

3. The amplifying circuit of claim 1, wherein the supply voltage adjusting circuit adjusts the variable supply voltage according to a voltage peak of at least one of the input and the output signals.

4. The amplifying circuit of claim 1, further comprising a control device coupled to the amplifier for generating a control signal according to at least one of the input signal and the output signal such that the supply voltage adjusting circuit adjusts the variable supply voltage according to the control signal.

5. The amplifying circuit of claim 4, wherein the supply voltage adjusting circuit comprises:
    an input for receiving an original supply voltage;
    an output for outputting the variable supply voltage;
    a plurality of capacitors coupled to the input and the output; and
    a plurality of switches respectively coupled to at least one of the input, the output, and the capacitors, each of the switches being switched on or off according to the control signal.

6. The amplifying circuit of claim 4, wherein the control device comprises:
    a peak detector for detecting a voltage peak of at least one of the input signal and the output signal;
    a voltage level sensor coupled to the peak detector for generating a sensing signal according to the voltage peak; and
    a gain control unit for outputting the control signal according to the sensing signal.

7. The amplifying circuit of claim 4, wherein the voltage converter selects one of the gain values for providing the variable supply voltage according to the control signal.

8. The amplifying circuit of claim 1, wherein the supply voltage adjusting circuit adjusts the variable supply voltage dynamically.

9. A method for adjusting a supply voltage provided to an amplifier that generates an output signal according to an input signal, the method cormprising:
    generating a control signal according to at least one of the input signal and the output signal; and
    adjusting the supply voltage according to the control signal, the step of adjusting the supply voltage cormprising:
    selecting one of a plurality of pain values according to the control signal; and adjusting the supply voltage according to the selected gain value.

10. The method of claim 9, wherein the gain value is selected according to a voltage peak of at least one of the input signal and the output signal.

11. The method of claim 9, wherein the control signal is generated according to a voltage peak of at least one of the input signal and the output signal.

12. The method of claim 9, wherein the step of adjusting the supply voltage comprises:
    changing on/off states of a plurality of switches coupled to a plurality of capacitors according to the control signal, so as to adjust the supply voltage.

13. The method of claim 12, wherein the plurality of switches and capacitors form a voltage converter such that the supply voltage is adjusted after passing through the voltage converter.

14. The method of claim 9, wherein the step of generating the control signal comprises:
    detecting a voltage peak of at least one of the input signal and the output signal;
    generating a sensing signal according to the voltage peak; and
    generating the control signal according to the sensing signal.

15. The method of claim 9, wherein the supply voltage is adjusted dynamically.

16. An amplifying circuit with a variable supply voltage comprising:
    an amplifier for receiving an input signal and outputting an output signal with the variable supply voltage;
    a control device coupled to the amplifier for generating a control signal, comprising:
    a peak detector for detecting a voltage peak of at least one of the input signal and the output signal;
    a voltage level sensor coupled to the peak detector for generating a sensing signal according to the voltage peak; and a gain control unit for outputting the control signal according to the sensing signal; and a supply voltage adjusting circuit coupled to the amplifier for adjusting the variable supply voltage according to the control signal.

17. The amplifying circuit of claim 16, wherein the supply voltage adjusting circuit comprises:

an input for receiving an original supply voltage;

an output for outputting the variable supply voltage;

a plurality of capacitors coupled to the input and the output; and a plurality of switches respectively coupled to at least one of the input, the output, and the capacitors, each of the switches being switched on or off according to the control signal.

18. A method for adjusting a supply voltage provided to an amplifier that generates an output signal according to an input signal, the method comprising:

generating a control signal, comprising:

detecting a voltage peak of at least one of the input signal and the output signal;

generating a sensing signal according to the voltage peak; and generating the control signal according to the sensing signal; and adjusting the supply voltage according to the control signal.

19. The method of claim 18, wherein the step of adjusting the supply voltage comprises:

changing on/off states of a plurality of switches coupled to a plurality of capacitors according to the control signal, so as to adjust the supply voltage.

* * * * *